United States Patent
Boles et al.

(10) Patent No.: US 8,174,050 B2
(45) Date of Patent: May 8, 2012

(54) STRUCTURE OF A PHEMT TRANSISTOR CAPABLE OF NANOSECOND SWITCHING

(75) Inventors: Timothy E. Boles, Tyngsboro, MA (US); Andrew K. Freeston, Windham, NH (US); Costas D. Varmazis, Chelmsford, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 220 days.

(21) Appl. No.: 12/643,088

(22) Filed: Dec. 21, 2009

(65) Prior Publication Data

US 2011/0147797 A1     Jun. 23, 2011

(51) Int. Cl.
    *H01L 29/778*    (2006.01)
    *H01L 21/338*    (2006.01)

(52) U.S. Cl. ......... 257/194; 257/E29.246; 257/E21.403; 257/E21.407; 438/172

(58) Field of Classification Search .................. 257/194, 257/E29.246, E21.403, E21.407; 438/172
See application file for complete search history.

(56) References Cited

U.S. PATENT DOCUMENTS 6,307,221 B1 * 10/2001 Danzilio ........................ 257/192
2009/0078966 A1 * 3/2009 Asai et al. ..................... 257/194

FOREIGN PATENT DOCUMENTS

JP     2008166836 A * 7/2008

OTHER PUBLICATIONS

A.F. Basile et al., "Experimental and Numerical Analysis of Gate- and Drain-Lag Phenomena in AlGaAs/InGaAs PHEMTs", 2002 IEEE Transactions of Electron Devices and Optoelectronic Applications, pp. 63-68.
Subhabrata Dhar et al., "Determination of Energetic Distribution of Interface States Between Gate Metal and Semiconductor in Sub-Micron Devices from Current-Voltage Characteristics", IEEE Transactions on Electron Devices, vol. 47, No. 2, Feb. 2000, pp. 282-287.
Andrew Freeston, "Understanding Gate Lag and how it differs from Switching Speed", Feature Article www.mpdigest.com., Sep. 2008, pp. 1-4.

* cited by examiner

*Primary Examiner* — Wensing Kuo
(74) *Attorney, Agent, or Firm* — Christopher P. Maiorana, PC (57) ABSTRACT

A method for fabricating a transistor and the resulting transistor is disclosed. The method generally includes steps (A) to (E). Step (A) may form a high mobility layer. The high mobility layer is generally configured to carry a two-dimensional electron gas. Step (B) may form a planar layer on the high mobility layer. Step (C) may form a barrier layer on the planar layer. Step (D) may form a doped layer on the barrier layer. The doped layer is generally a low bandgap III-V semiconductor. Step (E) may form a gate in contact with the doped layer. The gate may be separated from both a source and a drain by corresponding ungated recess regions. The high mobility layer, the planar layer, the barrier layer, the doped layer, the source, the gate and the drain are generally configured as a pseudomorphic high electron mobility transistor.

20 Claims, 8 Drawing Sheets

FIG. 1
(CONVENTIONAL)

FIG. 2
(CONVENTIONAL)

FIG. 3

(CONVENTIONAL)

STRUCTURE OF A PHEMT TRANSISTOR CAPABLE OF NANOSECOND SWITCHING

FIELD OF THE INVENTION

The present invention relates to pseudomorphic High Electron Mobility Transistors (pHEMT) generally and, more particularly, to a method and/or apparatus for implementing a structure of a pHEMT transistor capable of nanosecond switching.

BACKGROUND OF THE INVENTION

Figure 1:
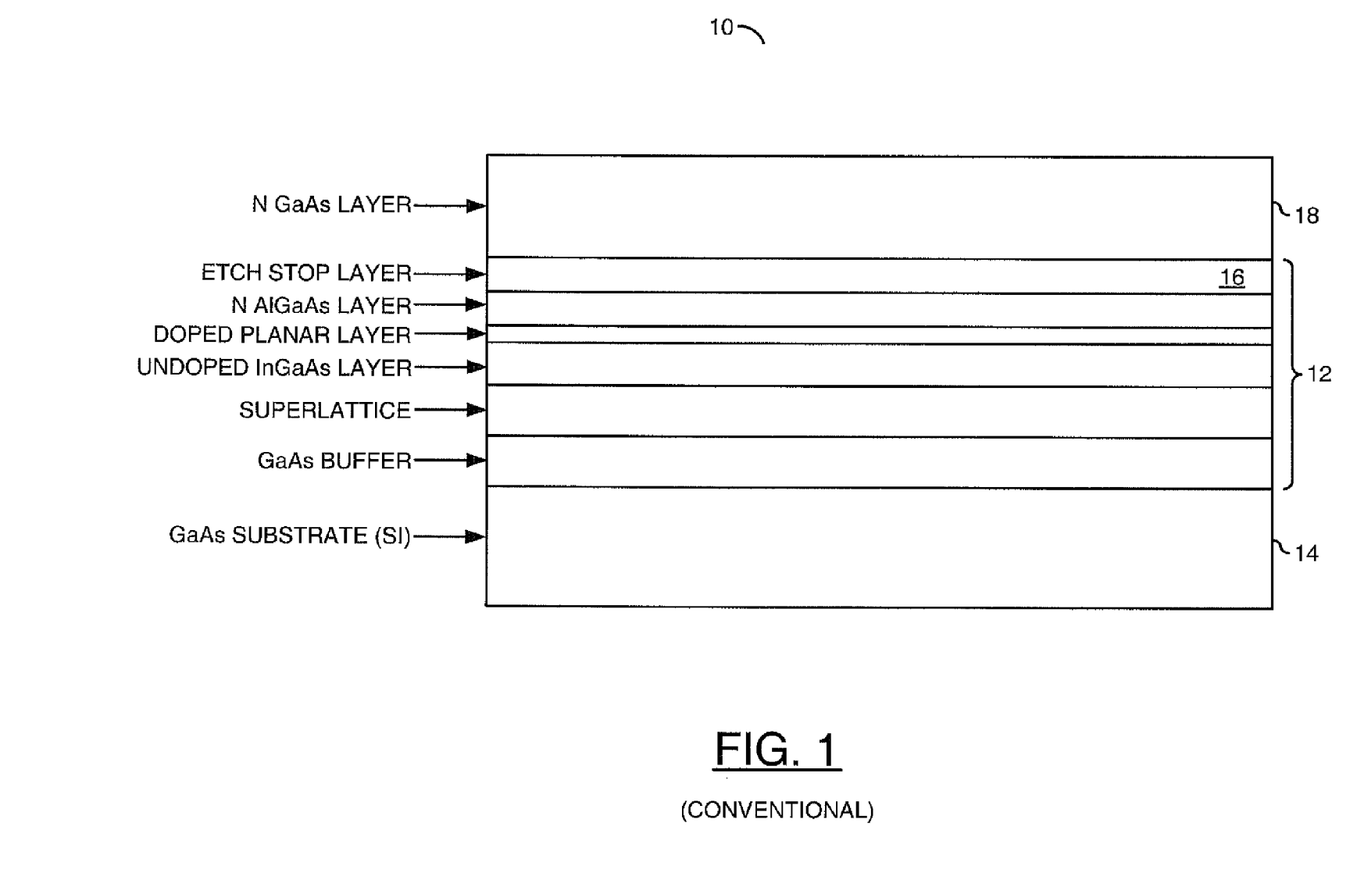
FIG. 1 is a cross sectional view of a conventional pHEMT epitaxial structure during fabrication.

Referring to FIG. 1, a cross sectional view of a conventional Gallium Arsenide (GaAs) pHEMT epitaxial structure 10 is shown during fabrication. Common GaAs pHEMT transistors used in switching applications have been available for over a decade. The transistors are produced by growing epitaxial layers 12 on a semi-insulating GaAs substrate 14 utilizing either Molecular Beam Epitaxy (MBE) or Metal-Organic Chemical Vapor Deposition Epitaxy (MOCVD) techniques. An optional updoped layer 16 is sometimes included. The layer 16 serves as an etch stop for etching an upper doped GaAs layer 18 during subsequent device fabrication. However, similar performances have been achieved without the etch stop layer 16 present.

Figure 2:
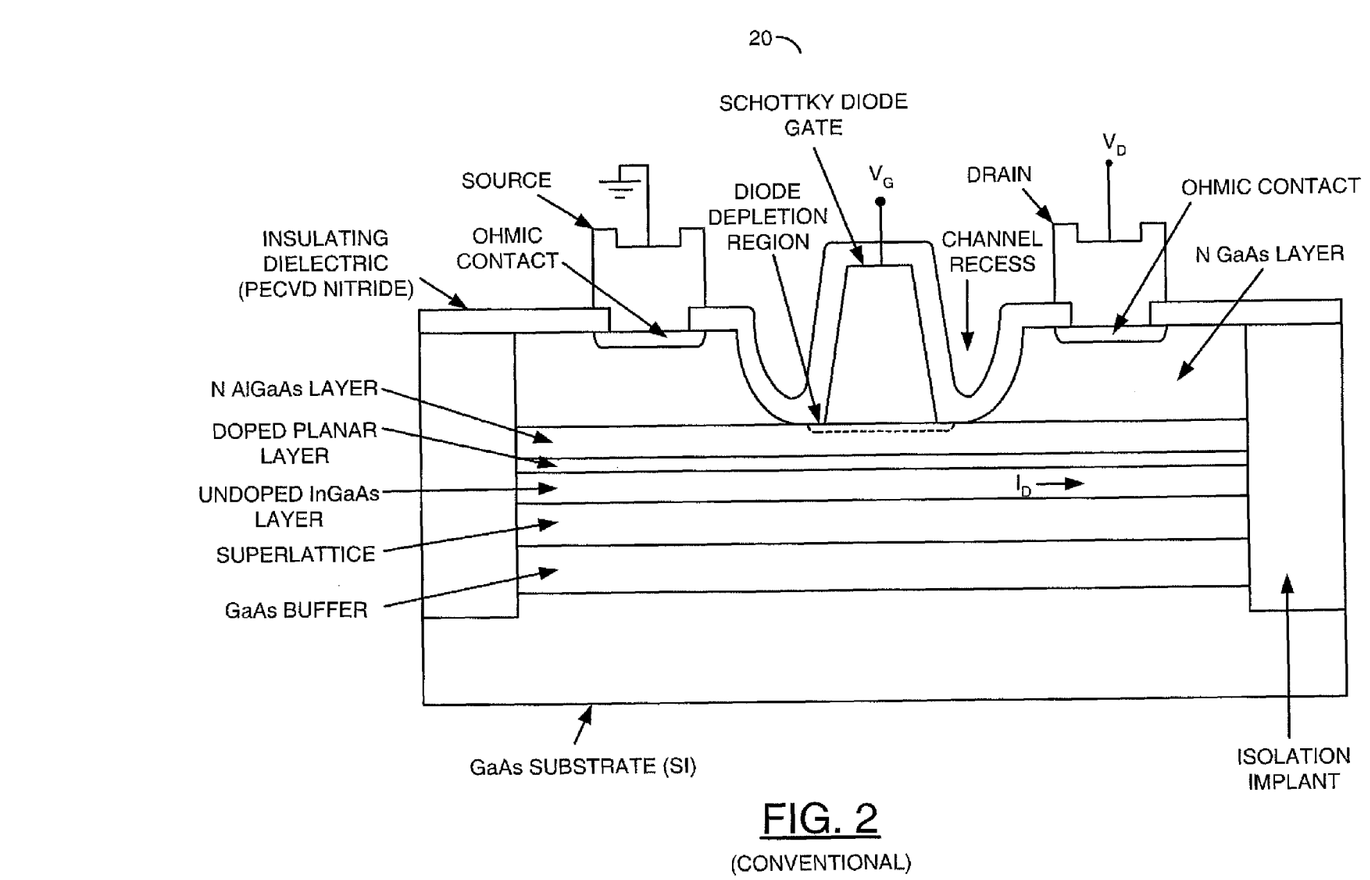
FIG. 2 is a simplified cross-sectional view of the conventional pHEMT.

Referring to FIG. 2, a simplified cross-sectional view of a conventional pHEMT 20 is shown. A source and a drain of the pHEMT 20 are formed by the deposition and sintering of an ohmic metallization. A gate/channel region is formed by performing a channel recess etch prior to a deposition of a Schottky gate metallization. A single recess etch structure is shown in FIG. 2, but multiple recesses are common to optimize device characteristics. Multiple gate structures are also fabricated for increased breakdown voltage and electrical isolation. A device-to-device isolation implant is formed by an ion implantation and by not removing the implant damage by subsequent anneals. The top surface of the transistor is passivated by the deposition of a dielectric using Plasma Enhanced Chemical Vapor Deposition (PECVD) techniques. Silicon nitride is commonly used as the dielectric. The device formed by the conventional technique has characteristics of high isolation, moderate radio-frequency (RF) power handling, frequency responses up through 40 gigahertz (GHz), very low current draw that is essentially zero except when switching states, and rise times (i.e., 10% to 90% of an RF envelope) and fall times (i.e., 90% to 10% of the RF envelope) of 50 to 100 nanoseconds.

While the rise times and the fall times are more than adequate, a difficulty with switching applications using the conventional pHEMT structures lies in a device gate lag time, or settling time, (i.e., the time for the RF envelope to increase from 90% to 98% or decrease from 10% to 2%). The best gate lag times reported for conventional pHEMTs are in the range of several hundred microseconds, which increases the total switching time of the pHEMT 20 by a factor of several thousand over the rise/fall times.

Figure 3:
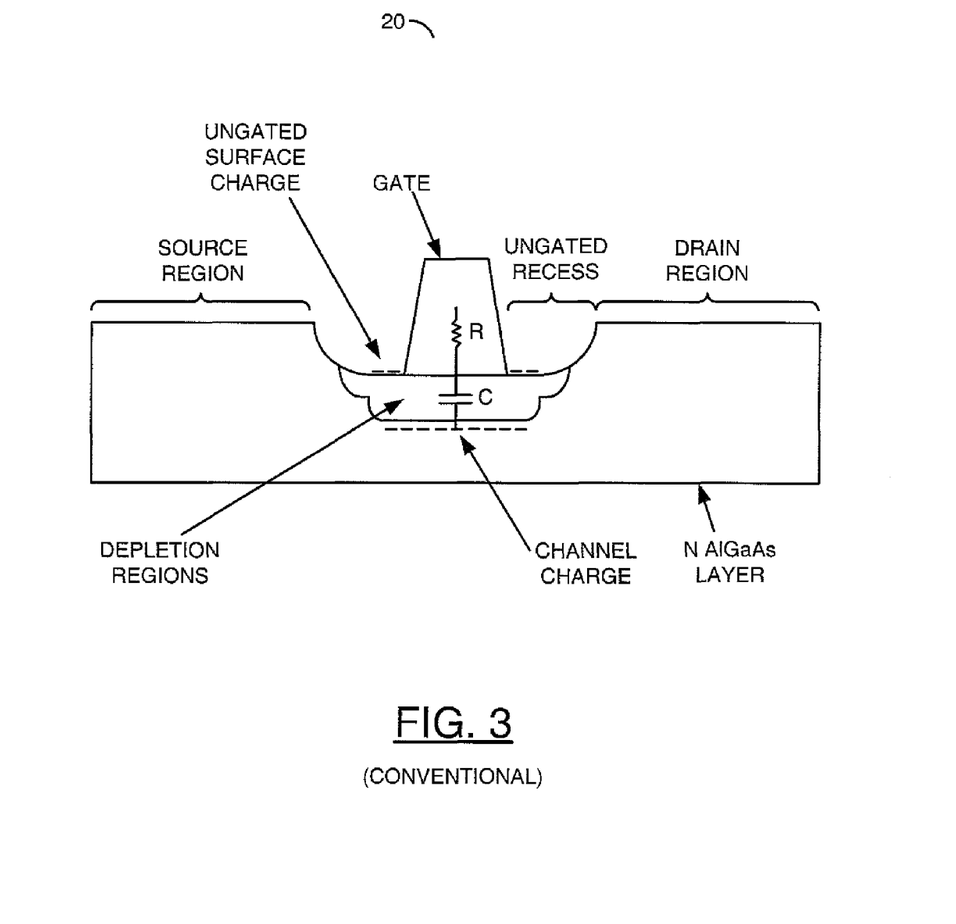
FIG. 3 is a partial cross-sectional view of the conventional pHEMT.

Referring to FIG. 3, a partial cross-sectional view of the conventional pHEMT 20 is shown. As illustrated, the gate of the transistor and a depletion region in the n-type AlGaAs layer form a resistor-capacitor (RC) charging and discharging network. The RC charging and discharging network limits a rate at which channel charge and any trapped charged surface states can be injected and removed from the device.

SUMMARY OF THE INVENTION

The present invention concerns a method for fabricating a transistor and the resulting transistor structure. The method generally includes steps (A) to (E). Step (A) may form a high mobility layer. The high mobility layer is generally configured to carry a two-dimensional electron gas. Step (B) may form a planar layer on the high mobility layer. Step (C) may form a barrier layer on the planar layer. Step (D) may form a doped layer on the barrier layers. The doped layer is generally a low bandgap III-V semiconductor. Step (E) may form a gate in contact with the doped layer. The gate may be separated from both a source and a drain by corresponding ungated recess regions. The high mobility layer, the planar layer, the barrier layer, the doped layer, the source, the gate and the drain are generally configured as a pseudomorphic high electron mobility transistor.

The objects, features and advantages of the present invention include providing a method and/or apparatus for implementing a structure of a pHEMT transistor capable of nanosecond switching that may (i) have short device gate lag times, (ii) minimize switching delays due to ungated surface charge, (iii) minimize switching delays due to depletion region channel charges, (iv) reduce on resistance of a source-to-drain channel, (v) reduce a gate resistance without increasing a gate capacitance and/or (vi) incorporate an additional layer that enhances movement of charges through the device.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 4:
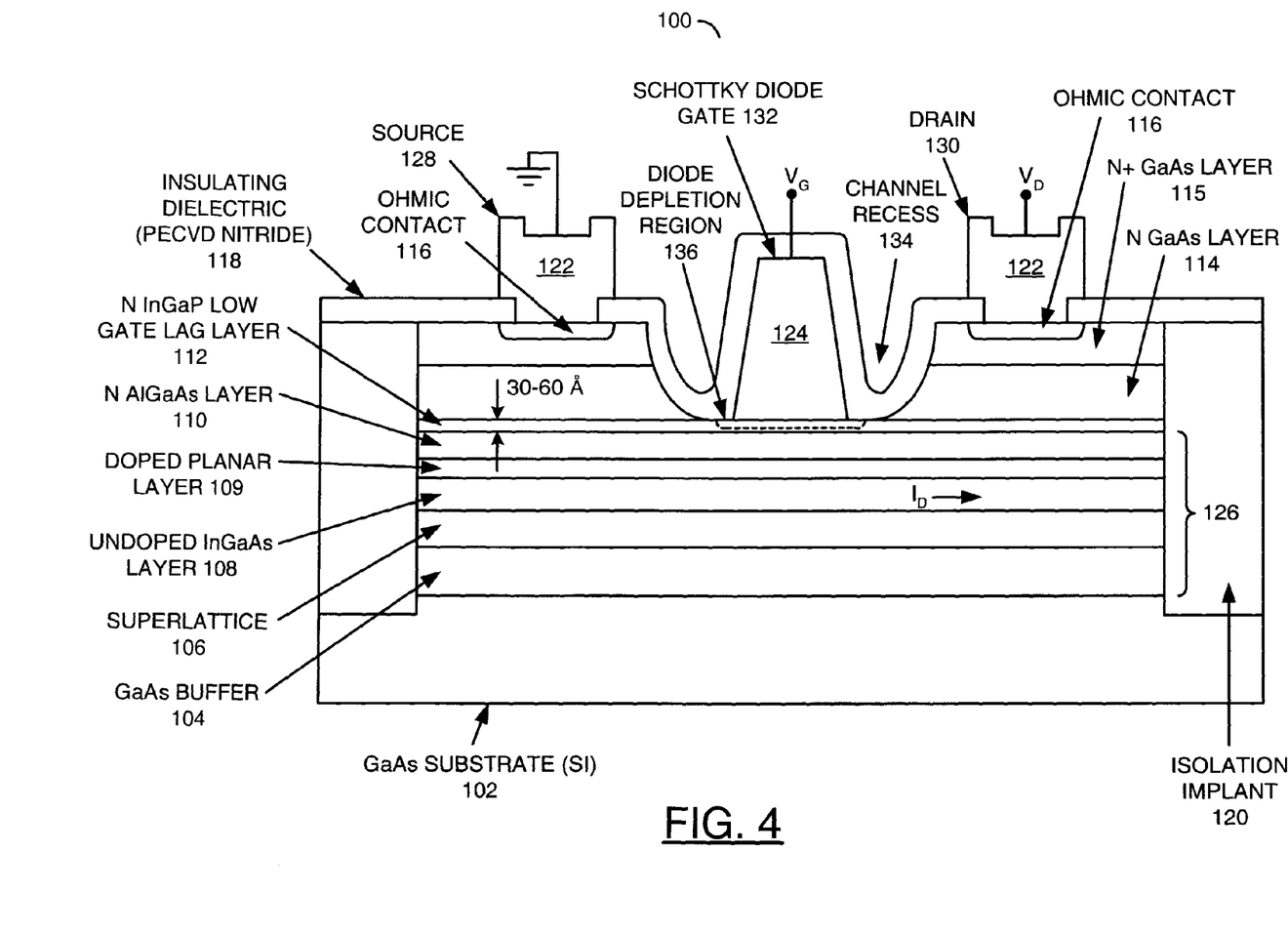
FIG. 4 is a block diagram of a first embodiment of an apparatus.

Referring to FIG. 4, a block diagram of a first embodiment of an apparatus 100 is shown. The apparatus (or device) 100 may implement a Gallium Arsenide (GaAs) pseudomorphic High Electron Mobility Transistor (pHEMT). The apparatus 100 generally comprises a substrate (or base) 102, a layer (or region) 104, a layer (or region) 106, a layer (or region) 108, a layer (or region) 109, a layer (or region) 110, a layer (or region) 112, a layer (or region) 114, a layer (or region) 115, multiple contacts (or connections) 116, a layer (or region) 118, one or more zones (or volumes) 120, a layer (or region) 122 and a layer (or region) 124. The layers 104 to 110 may be referred to as epitaxial layers 126. The layer 122 may be patterned to create a source 128 and a drain 130 of the transistor. The layer 124 may be patterned to create a gate 132 of the transistor. A channel recess 134 may be formed in the layers 114 and 115. The gate 132 may be formed on the layer 112 within the channel recess 134. The apparatus 100 is generally configured as a depletion mode device. The apparatus 100 may be normally "on" at no gate bias and is driven "off" by an application of a negative gate voltage relative to a source voltage.

The layer 102 generally comprises a substrate. The layer 102 may be created from Galium Arsenide (GaAs). In some embodiments, the layer 102 may be a semi-insulating (SI) substrate. Other substrate materials and doping levels may be implemented to meet the criteria of a particular application. The layer 104 generally comprises a buffer layer. The layer 104 may be created from GaAs and formed on the layer 102.

The layer 106 generally comprises a superlattice layer. The layer 106 may be formed on the layer 104. The layer 106 may provide buffering between the crystal structure in the layer 104 and the crystal structure in the layer 108.

The layer 108 may comprise an undoped layer. The layer 108 may be created from Indium Gallium Arsenide (InGaAs) and formed on the layer 106. The layer 108 generally carries a two-dimensional electron gas that provides conductivity (e.g., $I_D$) between the source 128 and the drain 130. The lack of doping in the layer 108 may enable high mobility of the electrons in the two-dimensional gas by limiting coulombic interactions generally caused by the dopants. As such, the layer 108 may be referred to as a high mobility layer. The layer 108 may be fabricated with other materials to meet the criteria of a particular application. The layer 109 generally comprises a doped planar layer.

The layer 109 may be formed on the layer 108 a single atom thick (e.g., a mono-layer). The layer 109 may be doped to approximately $5 \times 10^{12}$ dopants per centimeter squared ($cm^2$). In some embodiments, multiple layers 109 under the channel may be implemented. Silicon is generally used as the dopant to create an n-type layer 109 that donates electrons to the two-dimensional gas in the layer 108. Electrons for the two-dimensional gas generally diffuse from the layer 109 into the narrow bandgap material (e.g., InGaAs) in the layer 108. Other dopant types and/or doping levels may be implemented to meet the criteria of a particular application.

The layer 110 generally comprises a doped layer. The layer 110 may be created from an n-type AlGaAs on the layer 109. The layers 110/109 and 108 generally establish a hetrojunction that contains the two-dimensional electron gas in the layer 108. The higher conduction band (wider bandgap) of the layer 110 generally keeps the diffused electronics in relatively lower conduction band (narrower bandgap) of the layer 108. Thus, the layer 110 may be referred to as a barrier layer. Electrons for the two-dimensional electron gas in the layer 108 may also be donated from the layer 110. The layer 110 may be fabricated with other high barrier III-V semiconductor materials to meet the criteria of a particular application.

The layer 112 generally comprises a doped layer. The layer 112 may be created from n-type Indium Gallium Phosphide (InGaP) on the layer 110. The layer 112 is generally deposited to a thickness of approximately 30 to 60 angstroms. A doping concentration of the layer 112 generally ranges from at least $5 \times 10^{16}$ dopants (atoms) per centimeter cubed ($cm^3$) to around $5 \times 10^{18}$ dopants per $cm^3$. Dopants may include, but are not limited to silicon, germanium, tellurium and selenium. The layer 112 may be formed by Metal-Organic Chemical Vapor Deposition (MOCVD) or Molecular Beam Epitaxy (MBE) techniques. The layer 112 may be either crystalline, polycrystalline or amorphous in nature.

The layer 112 generally decreases the "on" resistance (e.g., Ron) of the apparatus 100 compared with ordinary pHEMT designs. Decreasing Ron may reduce a time constant of a gate resistor-capacitor (RC) charging/discharging network. Therefore, the layer 112 may be referred to as a low gate lag layer. The lower resistance Ron generally enables surface charges in the ungated recess regions (see FIG. 3) and channel charges to be inserted and/or removed at high speeds. As such, the layer 112 generally enables the apparatus 100 to have a short gate lag time (e.g., generally less than approximately 100 nanoseconds).

The n-type InGaP may be used to create the layer 112 in some embodiments because the InGaP generally has a low bandgap in relation to the n-type AlGaAs in the layer 110. The combination of the doping, doping level and lower band gap material may serve to increase a gate leakage, which effectively reduces Ron. In addition to the InGaP, other doped III-V materials that generally increase the gate leakage and/or reduces a Schottky barrier formed with the gate 132 may improve the gate lag time performance. Furthermore, other layer thicknesses and/or doping levels may be implemented in the layer 112 to meet the criteria of a particular application.

The layer 114 generally comprises a doped layer. The layer 114 may be created from n-type GaAs on the layer 112. The layer 115 generally comprises a heavily doped layer. The layer 115 may be created from n+ GaAs on the layer 114. Other materials may be implemented to meet the criteria of a particular application. One or more channel recesses 134 may be created by etching through the layers 115 and 114 down to the layer 112. The channel recess 134 may separate the drain 130 from the source 128 of the transistor.

The contacts 116 generally comprises ohmic contacts. The contacts 116 may be created by sintering a metal into the layer 115. In some embodiments, the layer 115 may be eliminated and the contacts 116 formed into the layer 114. The layer 118 generally comprises a passivation dielectric layer. The layer 118 may be created using Plasma Enhanced Chemical Vapor Deposition (PECVD) deposited silicon nitride. Other insulating materials may be used to meet the criteria of a particular application. The zones 120 generally establishes multiple isolation barriers. The zones 120 may be formed by ion implantations that are left un-annealed.

The layer 122 generally comprises a conductive layer. The layer 122 may be created using one or more metals and/or polysilicon on the contacts 116. The layer 122 may be patterned to define a source contact and a drain contact of the transistor. The layer 124 generally comprises a conductive layer.

The layer 124 may be created using one or more metals deposited on the layer 112. The layer 124 may be patterned to create the gate 132 of the transistor. As illustrated, the deposition and patterning may create a trapezoidal-shaped gate 132. A Schottky diode may be formed between the bottom surface of the gate 132 and a top surface of the layer 112. A variable depth diode depletion region 136 may be created under the gate 132 and generally extends into at least the layer 112. A voltage potential between the gate 132 and the layer 112 may control the two-dimensional electron gas flowing in the layer 108 and thus the source-to-drain current $I_D$.

As illustrated in FIG. 4, the layer 112 may be retained during the etching of layers 115 and 114 that forms the channel recess 134. The layer 124 (e.g., gate metallization) may be deposited directly onto the material of layer 112 to form the gate 132 of the apparatus 100. In addition, the number of surface states and interface traps in the ungated recess regions adjoining the gate 132 (see FIG. 3) may be reduced via a combination of cleaning techniques and the deposition of the passivation layer 118. Treatment and passivation of the exposed surface areas may cause many surface states to be tied up, and thus not subject to diffusion limited charging/discharging times.

Figure 5:
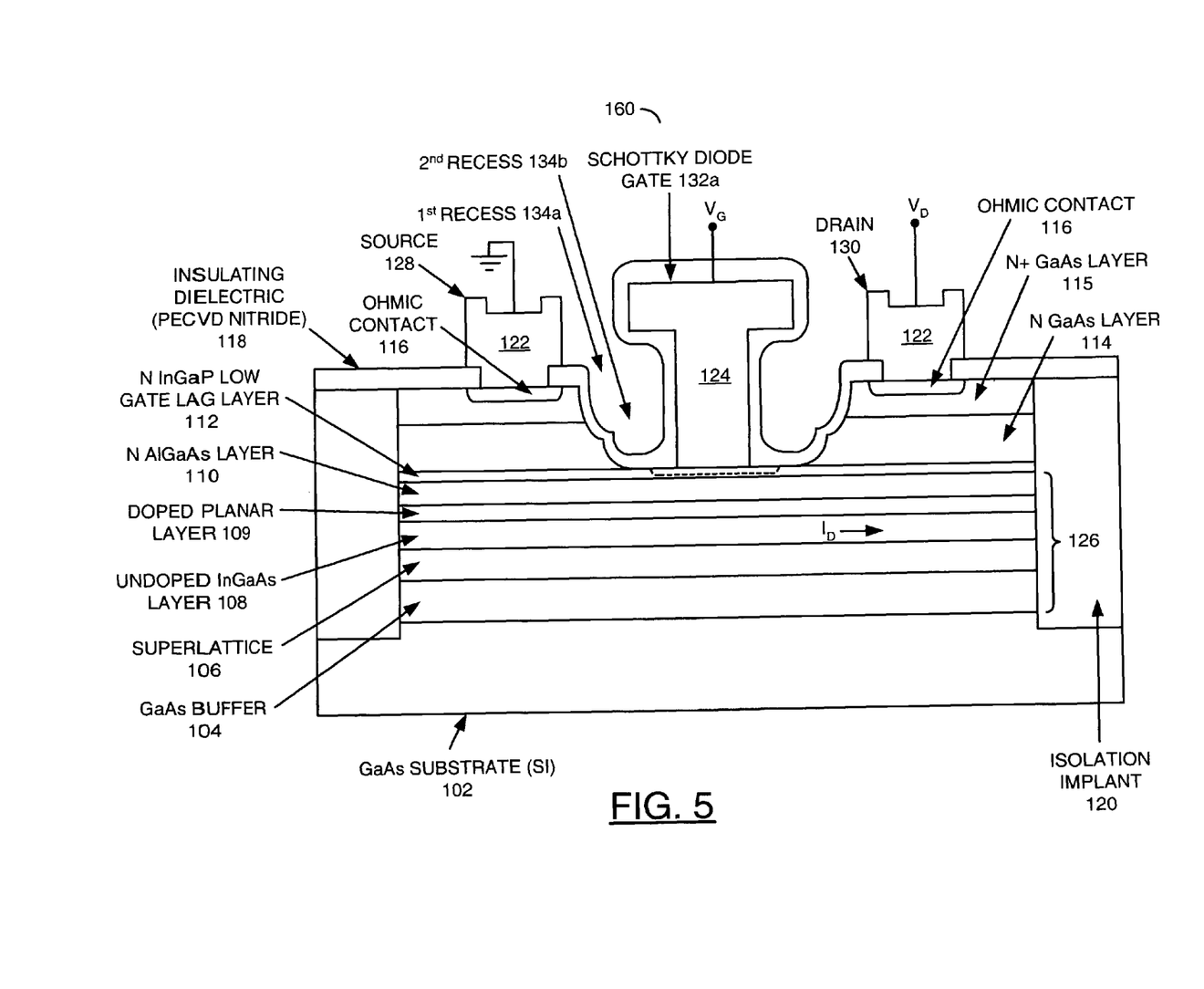
FIG. 5 is a cross-sectional view of a second embodiment of the apparatus in accordance with a preferred embodiment of the present invention.

Referring to FIG. 5, a cross-sectional view of an apparatus 160 is shown in accordance with a preferred embodiment of the present invention. The apparatus (or device) 160 may implement a second embodiment of a GaAs pHEMT. The apparatus 160 generally comprises the substrate 102, the layer 104, the layer 106, the layer 108, the layer 109, the layer 110, the layer 112, the layer 114, the layer 115, the contacts 116, the layer 118, the zones 120, the layer 122 and the layer 124. The layers 104 to 110 may be referred to as the epitaxial layers 126. The layer 122 may be patterned to create the source 128 and the drain 130 of the transistor. The layer 124 may be patterned to create the gate 132a of the transistor. Two or more channel recesses 134a and 134b may be formed in the layers 114 and 115. The gate 132a may be formed on the layer 112 partially within the channel recesses 134a and 134b. The apparatus 160 is generally configured as a depletion mode device. The apparatus 160 may be normally "on" at no gate bias and is driven "off" by the application of a negative gate voltage relative to the source voltage.

A design of the apparatus 160 may be a variation of the apparatus 100. A modification, compared with the apparatus 100, may occur in the etching of the layers 114 and 115. Two or more recess etchings may be performed to create the recesses 134a and 134b instead of the single recess 134. Another modification may occur in the fabrication of the gate 132a of the apparatus 160. A bottom half of the gate 132a may be shaped by an initial gate photoresist deposition and patterning. A top half of the gate 132a may be shaped by an additional gate photoresist deposition and patterning. A result may be the T-shaped gate 132a instead of the trapezoid-shaped gate 132. The T-shape of the gate 132a generally reduces the gate resistance with minimal to no additional gate capacitance thus minimizing the RC charging time associated with device turn-on and turn-off.

Figure 6:
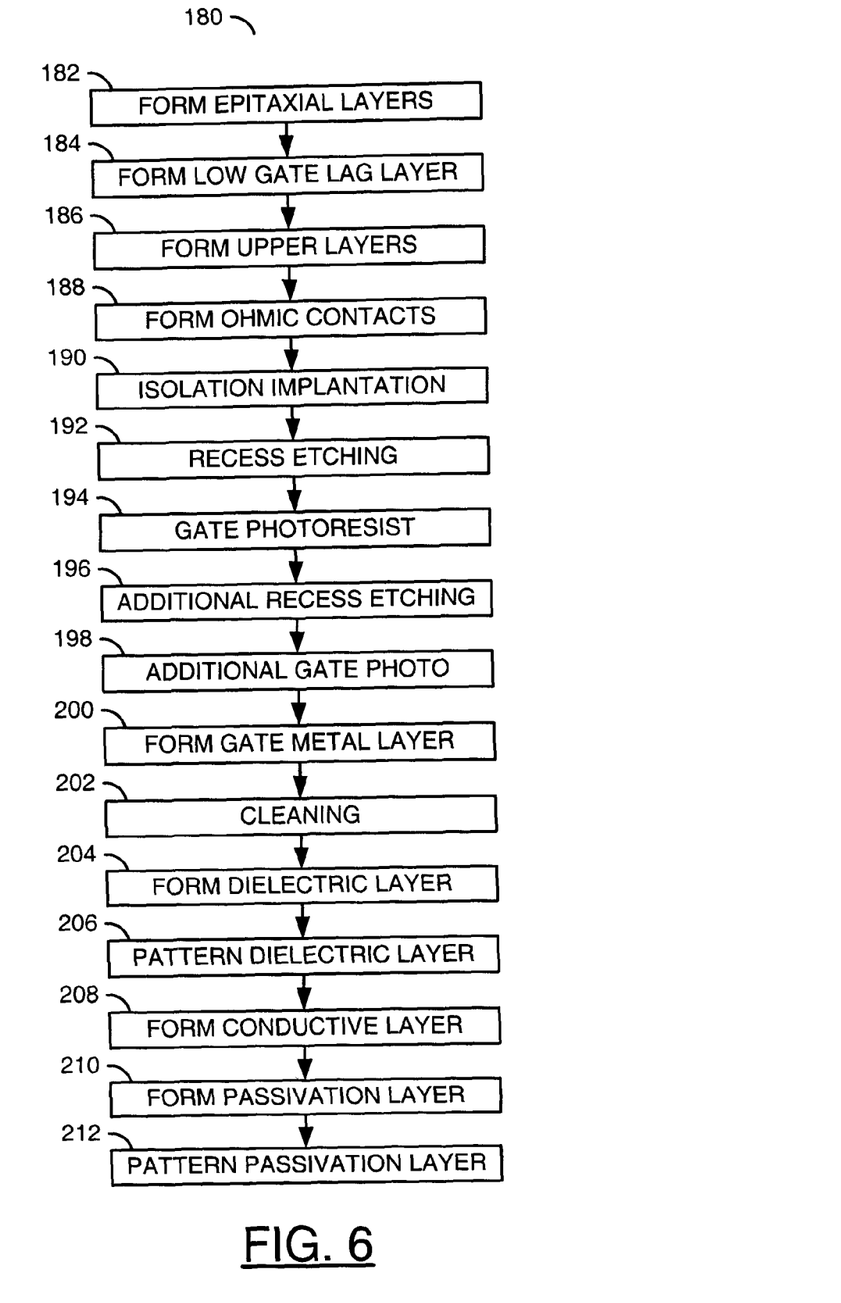
FIG. 6 is a flow diagram of a method for fabricating the apparatus.

Referring to FIG. 6, a flow diagram of a method 180 for fabricating the apparatuses 100 and 160 is shown. The method (or process) 180 generally comprises a step (or block) 182, a step (or block) 184, a step (or block) 186, a step (or block) 188, a step (or block) 190, a step (or block) 192, a step (or block) 194, an optional step (or block) 196, an optional step (or block) 198, a step (or block) 200, a step (or block) 202, a step (or block) 204, a step (or block) 206, a step (or block) 208, a step (or block) 210 and a step (or block) 212. The method 180 may be performed in a normal semiconductor fabrication facility using normal fabrication techniques.

In the step 182, the epitaxial layers 126 may be grown on the substrate 102. The layer 112 may be formed on the layer 110 in the step 184. Additional upper layers (e.g., layer 114 and layer 115) may be fabricated on the layer 112 in the step 186.

In the step 188, the ohmic contacts 116 of the source 128 and the drain 130 may be created. Ion implantations into the zones 120 may be performed in the step 190 to isolate individual transistors from each other. A recess etch may be performed in the step 192 to open the channel recess 134 or 134a.

In the step 194, a gate photoresist may be deposited and patterned to establish a shape of the gate 132 or a portion of the gate 132a. If the gate 132a is to be created, an additional recess etch may be performed in the step 196 to open the channel recess 134b. Furthermore, another gate photoresist may be deposited and patterned in the step 198 to establish a remainder of the gate 132a. In the step 200, layer 124 may be deposited and patterned to form the gate 132 or 132a.

In the step 202, one or more cleaning processes may be performed to minimize surface states and electrical trap sites in the ungated recess areas. The cleaning may be performed after the gate metallization has been deposited and patterned and the photoresist stripped. In some embodiments, the cleaning may be achieved with a downstream plasma surface treatment utilizing energetic neutral oxygen molecules for approximately 70 seconds. The plasma surface treatment is generally performed at approximately 2000 watts, at a temperature of about 190 degrees centigrade with a gas mixture of $O_2/N_2H_2$ in a FUSION reactor. In other embodiments, the cleaning may be achieved with a 10:1 $NH_4OH:H_2O$ wet clean for approximately 15 seconds followed by a spin dry.

The layer 118 may be deposited in the step 204 and patterned in the step 206. The layer 122 may be deposited and patterned in the step 208 to create a source contact and a drain contact. In the step 210, a passivation layer may be deposited. Patterning of the passivation layer may be performed in the step 212. Additional processing steps, such as the deposition and patterning of additional conductive layers, etching vias, planarization steps and the formation of a top protection layer, may be performed to meet the criteria of a particular fabrication technology.

Optimization for a low gate lag by the addition of the layer 112 generally results in improvements in the switching speeds of the apparatus 100 and the apparatus 160 over the standard pHEMT devices. Designs of the apparatus 100 and the apparatus 160 generally allow for a rapid change in the charged regions in and around the channel depletion area, giving the switching transition a sharp, desirable shape.

Figure 7:
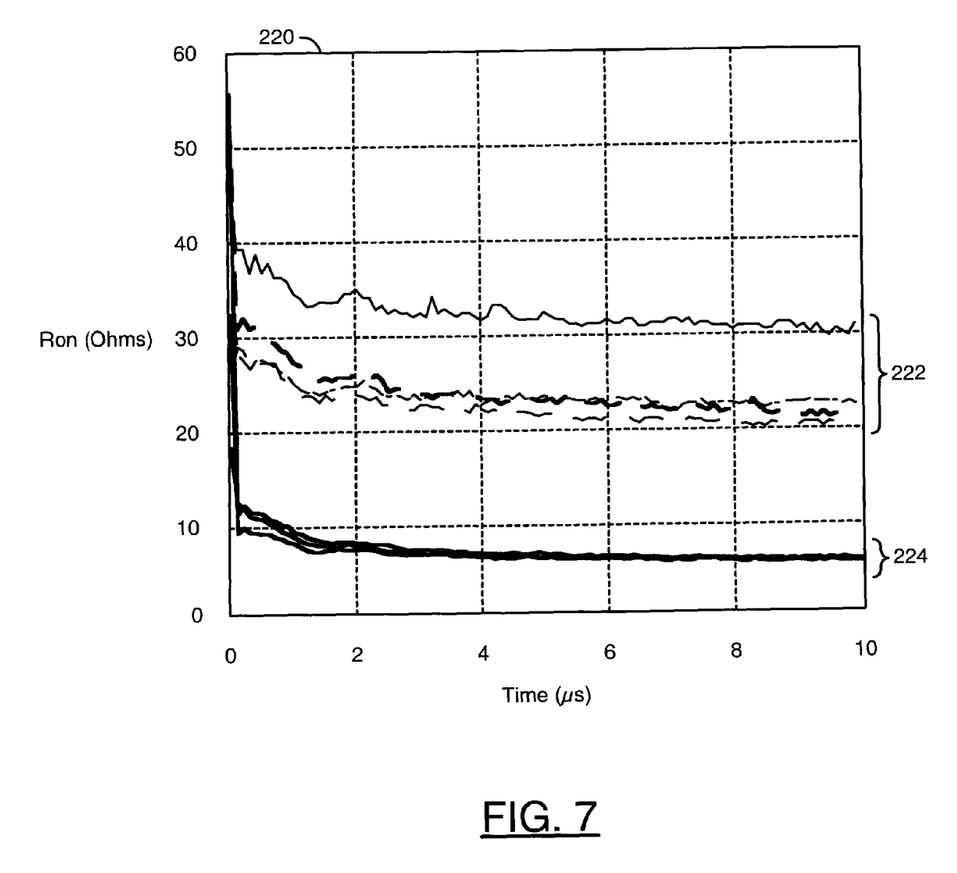
FIG. 7 is a graph of on resistances measured from multiple test devices.

Referring to FIG. 7, a graph 220 of the on resistances (Ron) measured from multiple test devices is shown. The several (e.g., 4 total) upper curves 222 generally illustrate the values of Ron as a function of time for multiple standard switching Field Effect Transistors (FETs) manufactured with a standard pHEMT process. The several (e.g., 3 total) lower curves 224 may illustrate the values of Ron as a function of time for multiple switching FETs manufactured by the method 180 to include the layer 112. Each curve may illustrate the results of a single device.

As illustrated by the graph 220, both the Ron performances and the device-to-device variations among the curves 224 are generally improved compared with the Ron performances and the device-to-device variations among the curves 222. The curves 224 also illustrate that the wafer-to-wafer switching characteristics may be more consistent where the process 180 is used in fabrication and the layer 112 is incorporated. When viewed over a longer period of time than illustrated, the slower curves 222 generally settle to a similar Ron as the faster curves 224. The tests also indicated that the FETs fabricated per the method 180 generally showed excellent stability over time. Furthermore, consider that in the isolated, or "off", condition each device generally has thousands of ohms of resistance between the source 128 and the drain 130. A standard device may meet a 90% (or 10%) RF envelope settled point rapidly, yet still has a long delay to get to the 98% (or 2%) settled level. As further illustrated by the curves 222, an absolute range of change among the standard devices may be large. As illustrated by the curves 224, the sharper turn-on/turn-off characteristics of the devices fabricated per the method 180 generally provide dependable rapid transitions.

Figure 8:
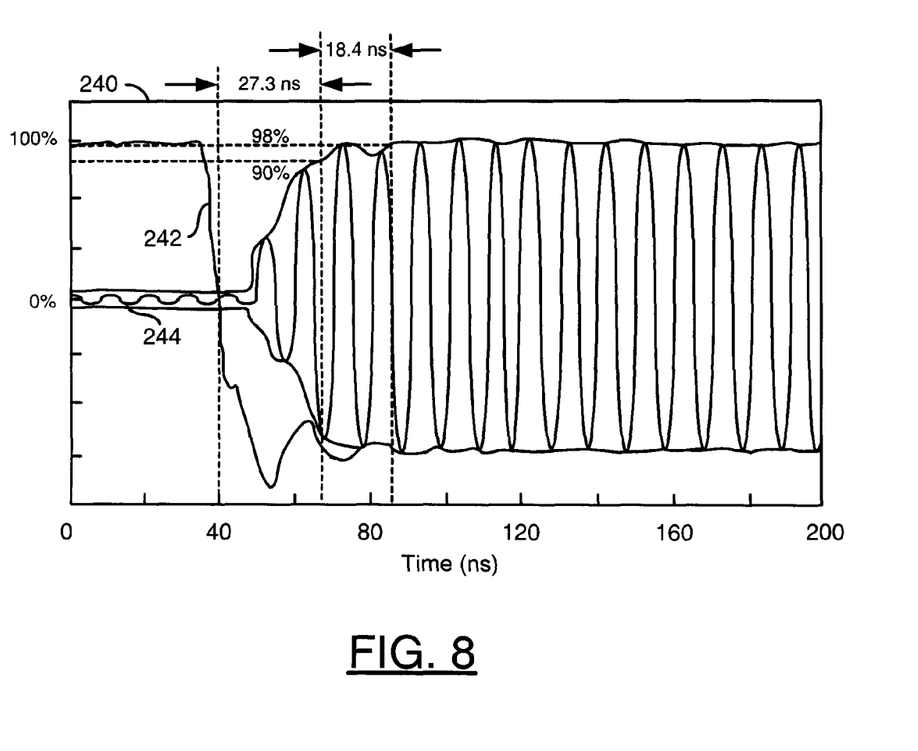
FIG. 8 is a graph of a measured example device performance.

Referring to FIG. 8, a graph 240 of a measured example device performance is shown. The example device was fabricated with the method 180 to include the doped layer 112 and the T-shaped gate 132a. The measured data generally shows a turn-on time of approximately 27.3 nanoseconds (ns) starting from the gate signal 242 passing through the 50% level until the RF envelope 244 reaches the 90% level. The gate lag delay of the RF envelope 244 from the 90% level to 98% level is generally achieved 18.4 nanoseconds later. In comparison, measurements of standard pHEMTs of similar dimensions resulted in gate lag delays of approximately 274 microseconds to greater than 300 microseconds. Hence, fabrication using the method 180 generally results in an improvement of the gate lag delay by almost a factor of 15,000 times compared with the standard pHEMT switch structure.

Additional measurements were made using a second device having an undoped layer 112 with the trapezoidal gate 132. The measured gate lag delay of the RF envelope from the 90% level to the 98% level was approximately 110 nanoseconds. The second device improved the gate lag delay by almost a factor of 2,500 times compared with the standard pHEMT switch structure. As a result of the bandgap engineering in the layer 112, measurements have shown a reduction of the gate lag switching times to less than 110 nanoseconds in some embodiments and less than 20 nanoseconds in other embodiments. In addition, improvements have been observed in the rise times achieving a 10% to 90% rise time of approximately 32 nanoseconds.

Improving the gate lag delay parameter may be beneficial in test systems, packet-based data transmissions, radar systems, and other applications that may be time-variation sensitive. The test data generally indicates that by proper device design, in conjunction with semiconductor fabrication process optimization, improvements in total switching speed, including gate lag settling time, may be achieved.

The functions and structures illustrated in the diagrams of FIGS. 4-6 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. A method for fabricating a transistor, comprising the steps of:
   (A) forming a high mobility layer, wherein said high mobility layer is configured to carry a two-dimensional electron gas;
   (B) forming a planar layer in contact with said high mobility layer, wherein said planar layer has a uniform composition;
   (C) forming a barrier layer in contact with said planar layer;
   (D) forming a doped layer in contact with said barrier layer, said doped layer (i) comprising a low bandgap III-V semiconductor and (ii) having a first surface that is doped;
   (E) forming a source and a drain in contact with said first surface of said doped layer; and
   (F) forming a gate in contact with said first surface of said doped layer, wherein (i) said gate is separated from both said source and said drain by corresponding ungated recess regions on said first surface of said doped layer and (ii) said high mobility layer, said planar layer, said barrier layer, said doped layer, said source, said gate and said drain are configured as a pseudomorphic high electron mobility transistor.

2. The method according to claim 1, wherein said doped layer has a dopant which establishes an on resistance that conducts (i) ungated surface charges in said ungated recess regions and (ii) channel charges adjacent a depletion region proximate said gate such that a gate lag time is less than 110 nanoseconds.

3. The method according to claim 2, wherein said gate lag time comprises a delay between at least one of (i) a rise from 90% to 98% of a radio frequency envelope and (ii) a fall from 10% to 2% of said radio frequency envelope.

4. The method according to claim 1, further comprising the step of:
   forming at least one semiconductor layer in contact with said doped layer, wherein said source and said drain are formed in said semiconductor layer.

5. The method according to claim 4, further comprising the step of:
   etching said semiconductor layer to form a channel recess, wherein said gate is disposed in said channel recess.

6. The method according to claim 1, further comprising the steps of:
   cleaning said first surface of said doped layer in said ungated recess regions after said forming of said gate; and
   forming a passivation layer in contact with said first surface of said doped layer in said ungated recess regions after said cleaning.

7. The method according to claim 1, wherein said gate is formed as a T-shaped gate.

8. The method according to claim 1, wherein said doped layer comprises an n-type InGaP layer.

9. The method according to claim 1, wherein said doped layer ranges from approximately 30 to 60 angstroms thick.

10. The method according to claim 1, wherein said doped layer comprises a concentration of at least $5 \times 10^{16}$ donors per $cm^3$.

11. An apparatus comprising:
    a high mobility layer, wherein said high mobility layer is configured to carry a two-dimensional electron gas;
    a planar layer formed in contact with said high mobility layer, wherein said planar layer has a uniform composition;
    a barrier layer formed in contact with said planar layer;
    a doped layer formed in contact with said barrier layer, said doped layer (i) comprising a low bandgap III-V semiconductor and (ii) having a first surface that is doped;
    a source formed in contact with said first surface of said doped layer;
    a drain formed in contact with said first surface of said doped layer; and
    a gate formed in contact with said first surface of said doped layer, wherein (i) said gate is separated from both said source and said drain by corresponding ungated recess regions on said first surface of said doped layer and (ii) said high mobility layer, said planar layer, said barrier layer, said doped layer, said source, said gate and said drain are configured as a pseudomorphic high electron mobility transistor.

12. The apparatus according to claim 11, wherein said doped layer has a dopant which establishes an on resistance that conducts (i) ungated surface charges in said ungated recess regions and (ii) channel charges adjacent a depletion region proximate said gate such that a gate lag time is less than 110 nanoseconds.

13. The apparatus according to claim 12, wherein said gate lag time comprises a delay between at least one of (i) a rise from 90% to 98% of a radio frequency envelope and (ii) a fall from 10% to 2% of said radio frequency envelope.

14. The apparatus according to claim 11, further comprising at least one semiconductor layer formed in contact with said doped layer, wherein said source and said drain are formed in said semiconductor layer.

15. The apparatus according to claim 14, further comprising a channel recess formed in said semiconductor layer, wherein said gate is disposed in said channel recess.

16. The apparatus according to claim 11, further comprising a passivation layer formed in contact with said first surface of said doped layer in said ungated recess regions.

17. The apparatus according to claim 11, wherein said gate is formed as a T-shaped gate.

18. The apparatus according to claim 11, wherein said doped layer comprises an n-type InGaP layer.

19. The apparatus according to claim 11, wherein said doped layer ranges from approximately 30 to 60 angstroms thick.

20. An apparatus fabricated in accordance with the method of claim 1.

* * * * *